US008108811B2

(12) United States Patent
Budell et al.

(10) Patent No.: US 8,108,811 B2
(45) Date of Patent: *Jan. 31, 2012

(54) VALIDATION OF ELECTRICAL PERFORMANCE OF AN ELECTRONIC PACKAGE PRIOR TO FABRICATION

(75) Inventors: Timothy W. Budell, Milton, VT (US); Patrick H. Buffett, Essex Junction, VT (US); Craig P. Lussier, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 662 days.

This patent is subject to a terminal disclaimer.

(21) Appl. No.: 12/203,955

(22) Filed: Sep. 4, 2008

(65) Prior Publication Data

US 2008/0320424 A1 Dec. 25, 2008

Related U.S. Application Data

(60) Continuation of application No. 11/234,560, filed on Sep. 23, 2005, now Pat. No. 7,454,723, which is a division of application No. 10/721,966, filed on Nov. 25, 2003, now Pat. No. 6,978,214.

(51) Int. Cl.
*G06F 17/50* (2006.01)
(52) U.S. Cl. ........ 716/104; 716/105; 716/106; 716/107; 716/108; 716/111
(58) Field of Classification Search .......... 716/100–111, 716/136–139
See application file for complete search history.

(56) References Cited

U.S. PATENT DOCUMENTS

| 4,952,871 | A | 8/1990 | Driller et al. |
| 5,311,404 | A | 5/1994 | Trask et al. |
| 5,893,508 | A | 4/1999 | Oh |
| 6,066,561 | A | 5/2000 | Kumar et al. |
| 6,297,653 | B1 | 10/2001 | Hembree |
| 6,598,207 | B1 | 7/2003 | Teague, III |
| 6,643,831 | B2 | 11/2003 | Chang et al. |
| 6,820,046 | B1 | 11/2004 | Lamson et al. |
| 7,114,138 | B1 | 9/2006 | Teig et al. |

(Continued)

OTHER PUBLICATIONS

Notice of Allowance (Mail Date Jul. 14, 2008) for U.S. Appl. No. 11/234,560, filed Sep. 23, 2005; Confirmation No. 1242.

(Continued)

*Primary Examiner* — Paul Dinh
(74) *Attorney, Agent, or Firm* — Schmeiser, Olsen & Watts; Wenjie Li

(57) ABSTRACT

An electrical resistance determination method. Input to the method includes a description of at least one electrical network within a substrate. The description includes specification of a plurality of first ports on a first side of the substrate, and a plurality of second ports on a second side of the substrate, for each electrical network. All of the first ports are electrically isolated from one another. All of the second ports are electrically connected to a common voltage. A computer readable program code, which is executed by a processor of a computer system computes for a first electrical network of the at least one electrical network an electrical resistance between each first port and a port of the second ports. The computer code may also display a perspective plot of the computed electrical resistances as a bar oriented about normal to each first port.

20 Claims, 14 Drawing Sheets

U.S. PATENT DOCUMENTS

2002/0080316 A1   6/2002  Tsai
2005/0055191 A1   3/2005  Hogyoku
2005/0077907 A1   4/2005  Parker et al.
2005/0138584 A1*  6/2005  Beattie et al. .................... 716/5

OTHER PUBLICATIONS

Daisy Chain Burn-In Board Design and Methods; Research Disclosure, Jan. 2001; pp. 86-87.

Albert E. Ruehli; Survey of Computer-Aided Electrical Analysis of Integrated Circuit Interconnections; IBM J. Res. Develop., vol. 23, No. 6, Nov. 1979; pp. 626-639.

Li et al.; Substrate Modeling and Lumped Substrate Resistance Extraction for CMOS ESD/Latchup Circuit Simulation; 1999 ACM; pp. 549-554.

Zheng et al.; Transient and Crosstalk Analysis of Interconnection Lines for Single Level Integrated Packaging Modules; 1998 IEEE; pp. 120-123.

Chandrasekhar et al.; Modelling and Characterisation of the Polymer Stud Grid Array (PSGA) Package: Electrical, Thermal and Thermomechanical Qualification; 2001 Electronic Components and Technology Conference; 2001 IEEE; 8 pages.

* cited by examiner

VALIDATION OF ELECTRICAL PERFORMANCE OF AN ELECTRONIC PACKAGE PRIOR TO FABRICATION

This application is a continuation application claiming priority to Ser. No. 11/234,560, filed Sep. 23, 2005, U.S. Pat. No. 7,454,723, issued Nov. 18, 2008, which is a divisional of U.S. Pat. No. 6,978,214, issued Dec. 20, 2005.

BACKGROUND OF THE INVENTION

1. Technical Field

The present invention relates to a method and computer program product for determining and displaying electrical resistances within an electronic package.

2. Related Art

Optimizing an electronic package with respect to the electrical resistances therein is difficult and time consuming if the electronic package is geometrically complex. Thus, there is a need for an efficient method and computer program product for improving or optimizing an electronic package with respect to the electrical resistances therein.

SUMMARY OF THE INVENTION

The present invention provides an electrical resistance determination method, comprising the steps of:

specifying as input to a computer readable program code a description of at least one electrical network comprised by a first substrate, said description including specification of a plurality of first ports on a first side of the first substrate for each electrical network such that all of said first ports are electrically isolated from one another, said description further including specification of a plurality of second ports on a second side of the first substrate for each electrical network such that all of said second ports are electrically connected to a common voltage; and executing said computer readable program code by a processor of a computer system, said executing including computing for a first electrical network of the at least one electrical network an electrical resistance between each first port and port of the second ports.

The present invention provides a computer program product, comprising a computer usable medium having a computer readable program code embodied therein, wherein the computer readable program code is adapted to perform an electrical resistance determination by a method comprising the steps of:

receiving input, said input including a description of at least one electrical network comprised by a first substrate, said description including specification of a plurality of first ports on a first side of the first substrate for each electrical network such that all of said first ports are electrically isolated from one another, said description further including specification of a plurality of second ports on a second side of the first substrate for each electrical network such that all of said second ports are electrically connected to a common voltage; and executing said computer readable program code by a processor of a computer system, said executing including computing for a first electrical network of the at least one electrical network an electrical resistance between each first port and a port of the second ports.

The present invention provides an electronic package design method, comprising the steps of:

a) specifying as input to a computer readable program code a description of N electrical networks comprised by a first substrate, said N electrical networks being denoted as electrical networks E(1), E(2), . . . , E(N), said description including an electrical path map of the N electrical networks of the first substrate, said description further including specification of a plurality of first ports on a first side of the first substrate for each electrical network such that all of said first ports are electrically isolated from one another, said description further including specification of a plurality of second ports on a second side of the first substrate for each electrical network such that all of said second ports are electrically connected to a common voltage, said $N \geq 1$;

b) first executing said computer readable program code by a processor of a computer system, said first executing including computing for each electrical network of the N electrical networks an unadjusted electrical resistance between each first port and a port of the second ports;

c) if N=1 then executing step h), else executing step d);

d) setting an integer I=1 and setting an integer J=2;

e) if $I \neq J$ then second executing said computer readable program code by the processor, said second executing including computing for electrical network E(I) of the N electrical networks a nearest-neighbor adjusted electrical resistance R(I,J) of electrical network E(I) with respect to electrical network E(J) between each first port of E(I) and a port of the second ports of E(I), else executing step f);

f) if J<N then incrementing J by 1 followed by executing step e), else executing step g);

g) if I<N−1 then incrementing I by 1 and setting J=1 followed by executing step e), else executing step h);

h) determining whether a set of electrical resistances collectively satisfy acceptance criteria, wherein the set of electrical resistances includes the computed unadjusted electrical resistances, and wherein if N>1 then the set of electrical resistances further includes the computed nearest-neighbor adjusted electrical resistances; and i) if the set of electrical resistances collectively satisfy said acceptance criteria then terminating said method, else modifying said description of the N electrical networks so as to increase a probability of satisfying said acceptance criteria followed by executing steps a)-i).

The present invention advantageously provides an efficient method and computer program product for improving or optimizing an electronic package with respect to the electrical resistances therein.

BRIEF DESCRIPTION OF THE DRAWINGS

Thus

DETAILED DESCRIPTION OF THE INVENTION

Figure 1:
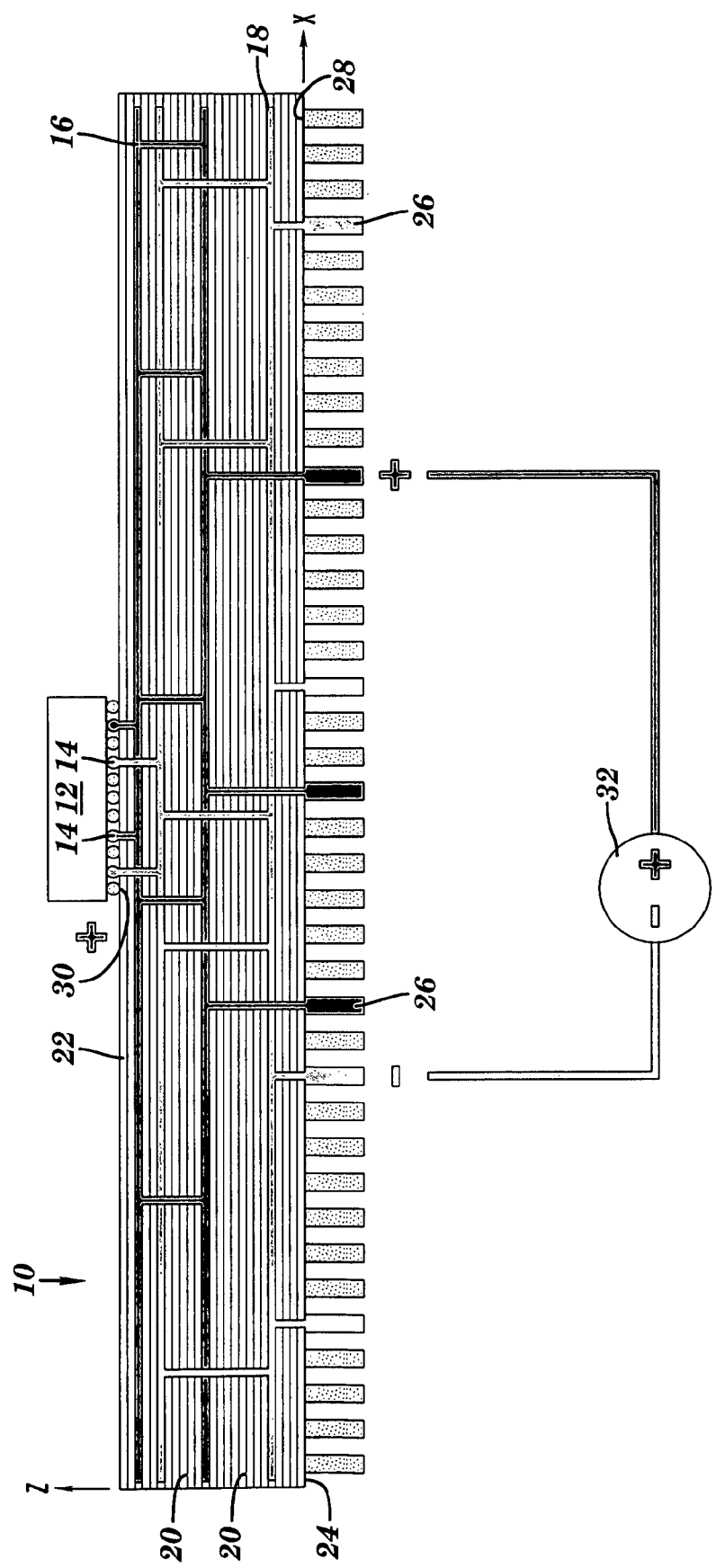
FIG. 1 depicts a front, cross-sectional view of an electronic package to which an electronic device is electrically connected, in accordance with embodiments of the present invention.

FIG. 1 depicts a front, cross-sectional view of an electronic package or substrate 10 to which an electronic device or substrate 12 is electrically connected with electrical interconnections 14 at the top surface 22 of the electronic package or substrate 10, in accordance with embodiments of the present invention. The electronic package or substrate 10 may comprise, inter alia, a chip carrier. The electronic device or substrate 12 may comprise, inter alia, a semiconductor chip. The interconnections 14 may comprise, inter alia, solder balls such as controlled collapse chip connection (C4) solder balls. Ports 30 are locations on the top surface 22 of the electronic package 10 wherein the interconnections 14 connect to the electronic package 10.

FIG. 1 also depicts a voltage source 32 for powering the electronic device 12. The voltage source 32 may comprise, inter alia, an external battery or a voltage source on a circuit board (not shown) that is connected to the electronic package 10 through interconnections 26 at the bottom surface 24 of the electronic package 10. The interconnections 26 may comprise, inter alia, solder columns, a ball grid array (BGA), land grid array (LGA), etc. Ports 28 are locations on the bottom surface 24 of the electronic package 10 wherein the interconnections 26 connect to the electronic package 10.

FIG. 1 also depicts orthogonal X and Z axes. The Z axis is normal to the top surface 22 and bottom surface 24 of the electronic package 10. The X axis is parallel to the top surface 22 and bottom surface 24.

The electronic package 10 includes an electrical network 16, namely a VDD network connected to the positive terminal of the voltage source 32. The electronic package 10 also includes an electrical network 18, namely a GND network connected to the negative terminal of the voltage source 32. Thus FIG. 1 shows multiple closed electrical loops, wherein each such closed electrical loop results in current flow from the positive terminal of the voltage source 32 to the electronic package 10 (through interconnections 26), through the electronic package 10 to its top surface 22 by means of an electrical path of the VDD electrical network 16, to the electronic device 12 (through interconnections 14), through an electrical path within the electronic device 12, back to the electronic package (through interconnections 14), through the electronic package 10 to its bottom surface 24 by means of an electrical path of the GND electrical network 18, to the negative terminal of the voltage source 32 (through interconnections 26). The electronic package 10 may also include additional electrical networks such as additional VDD networks connected to the positive terminal of corresponding additional voltage sources and/or additional GND networks connected to the negative terminal of corresponding additional voltage sources.

For notational purposes herein, electrical networks labeled VDD, VDD1, VDD2, . . . etc., are understood to identify electrical networks which are connected to a positive terminal of a voltage supply. Similarly, electrical networks labeled GND, GND1, GND2, . . . etc., are understood to identify electrical networks which are connected to a negative terminal of a voltage source.

Since the voltage source 32 serves to power the chip 12, the electronic package 10 design should be such that voltage losses through the electrical networks 16 and 18 are as small as possible. Although one could generate the electronic package 10 design, build the electronic package 10 in accordance with the design, physically test the as-built electronic package 10 for voltage losses to determine if the design is acceptable, and modify the design if the design is not acceptable, such a process is expensive and time consuming. Accordingly, the present invention performs the testing of the design by computer simulation so that the electronic package 10 does not have to be physically fabricated until the design is finalized. In the computer simulation, grid planes 20 are defined within the electronic package 10. The grid planes 20 are parallel to each other and parallel to the top surface 22 and the bottom surface 24 of the electronic package 10.

Figure 2:
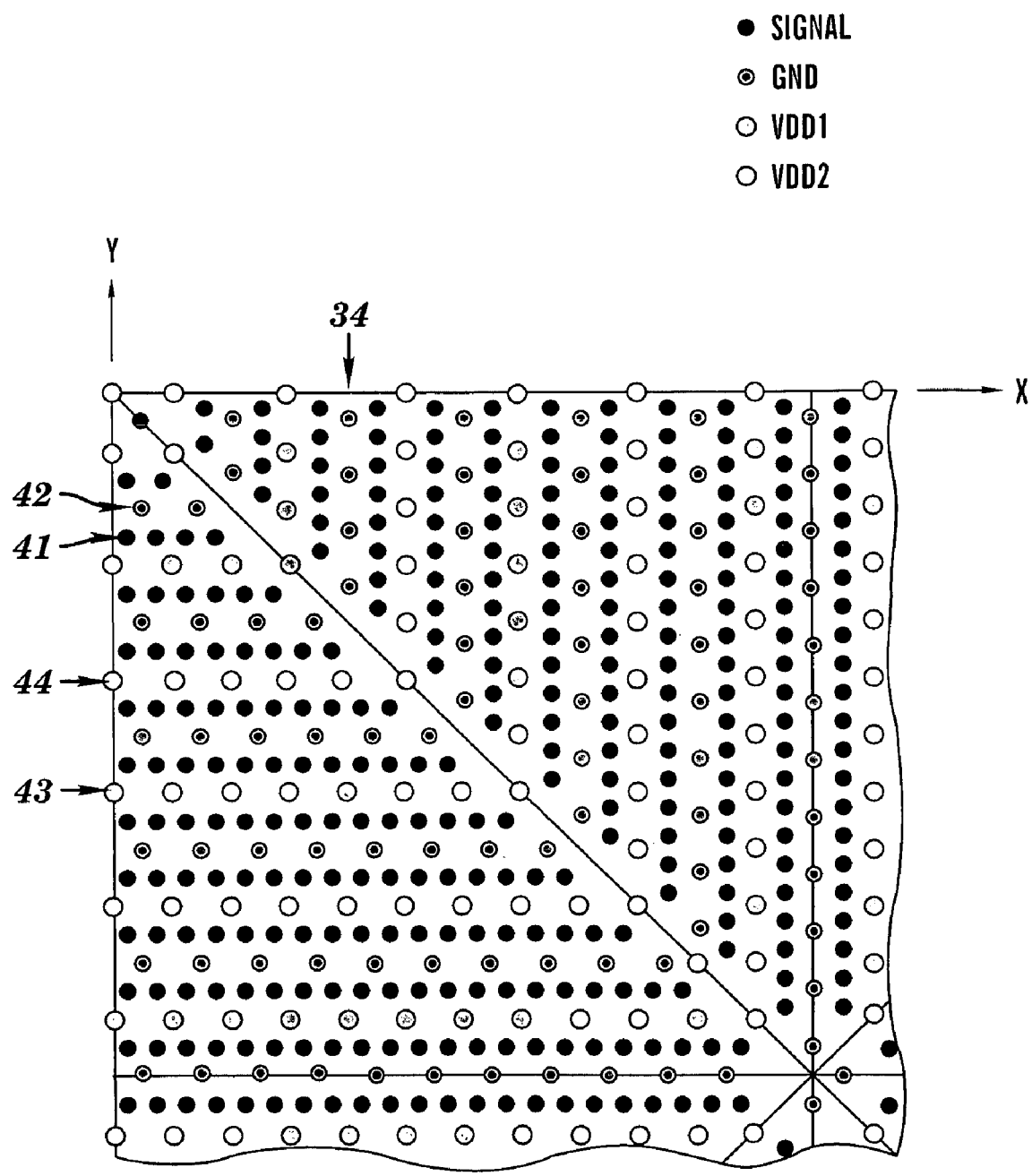
FIG. 2 depicts a portion of a top surface of an electronic package, analogous to the top surface of the electronic package of FIG. 1, in accordance with embodiments of the present invention.

FIG. 2 depicts a portion of a top surface 34 of an electronic package, analogous to the top surface 22 of the electronic package 10 of FIG. 1, in accordance with embodiments of the present invention. The portion of the top surface 34 is slightly more than a quadrant and may represent a portion of a typical C4 footprint of connections between an electronic package top surface and a chip. FIG. 2 depicts ports 41 associated with signal lines, ports 42 representing terminal points of lines of a GND electrical network in the electronic package, ports 43 representing terminal points of lines of a VDD1 electrical network in the electronic package, and ports 44 representing terminal points of lines of a VDD2 electrical network in the electronic package. Some embodiments include five VDD electrical networks (i.e., VDD1, VDD2, VDD3, VDD4, VDD5) such that VDD1 has ports in all four quadrants and each of VDD2, VDD3, VDD4, and VDD5 have ports in a different quadrant of the top surface of the electronic package. FIG. 2 also depicts orthogonal X and Y axes, which are parallel to the top surface 34.

Figure 3:
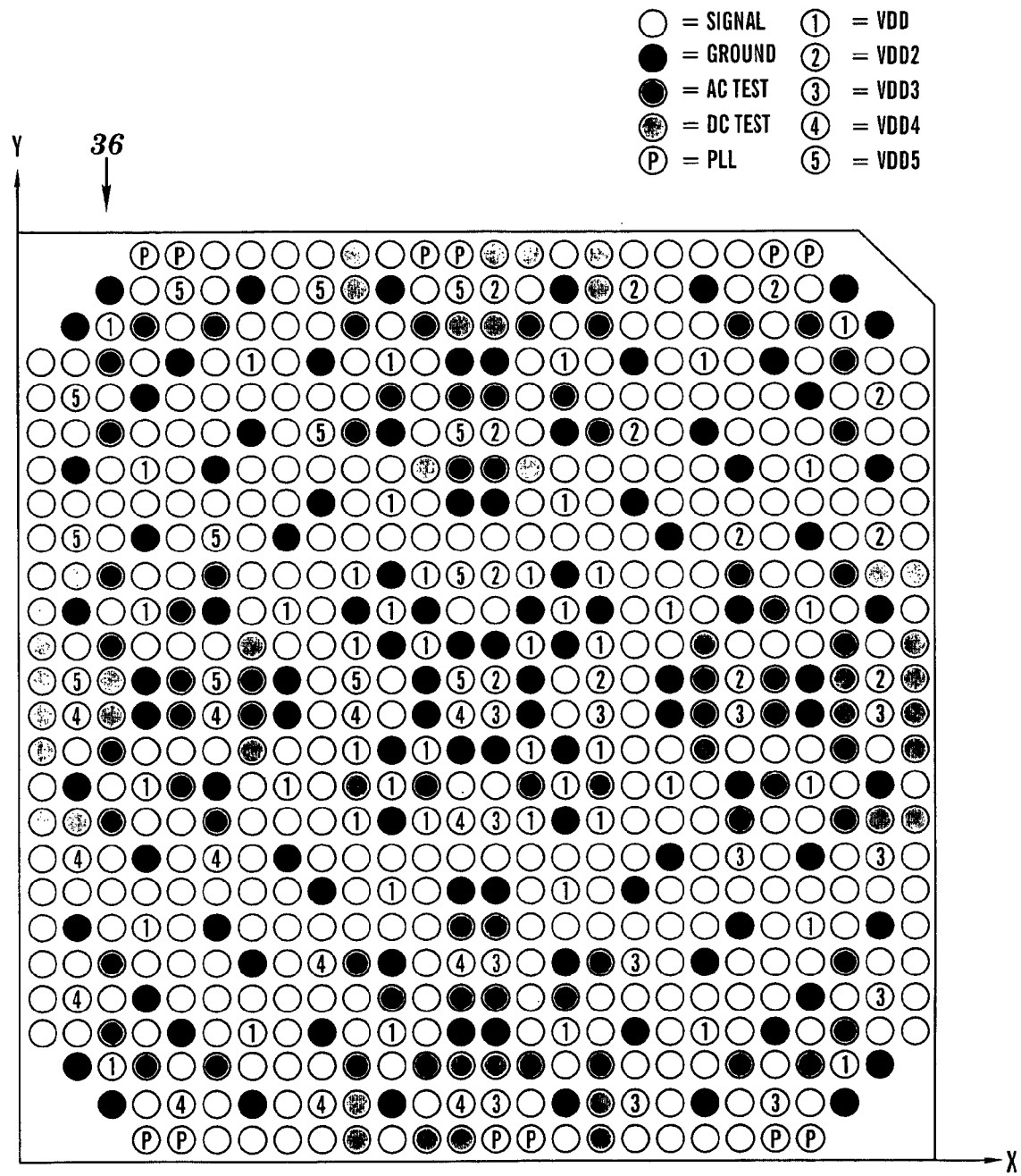
FIG. 3 depicts a portion of a bottom surface of an electronic package, analogous to the bottom surface of the electronic package of FIG. 1, in accordance with embodiments of the present invention.

FIG. 3 depicts a portion of a bottom surface 36 of an electronic package, analogous to the bottom surface 24 of the electronic package 10 of FIG. 1, in accordance with embodiments of the present invention. The bottom surface 36 may represent a portion of a typical BGA footprint of connections between an electronic package bottom surface and a circuit board. As shown in FIG. 3, the bottom surface 36 includes ground ports as well as VDD ports, VDD2 ports, VDD3 ports, VDD4 ports, and VDD5 ports. FIG. 3 also depicts orthogonal X and Y axes, which are parallel to the bottom surface 36.

Figure 4B:
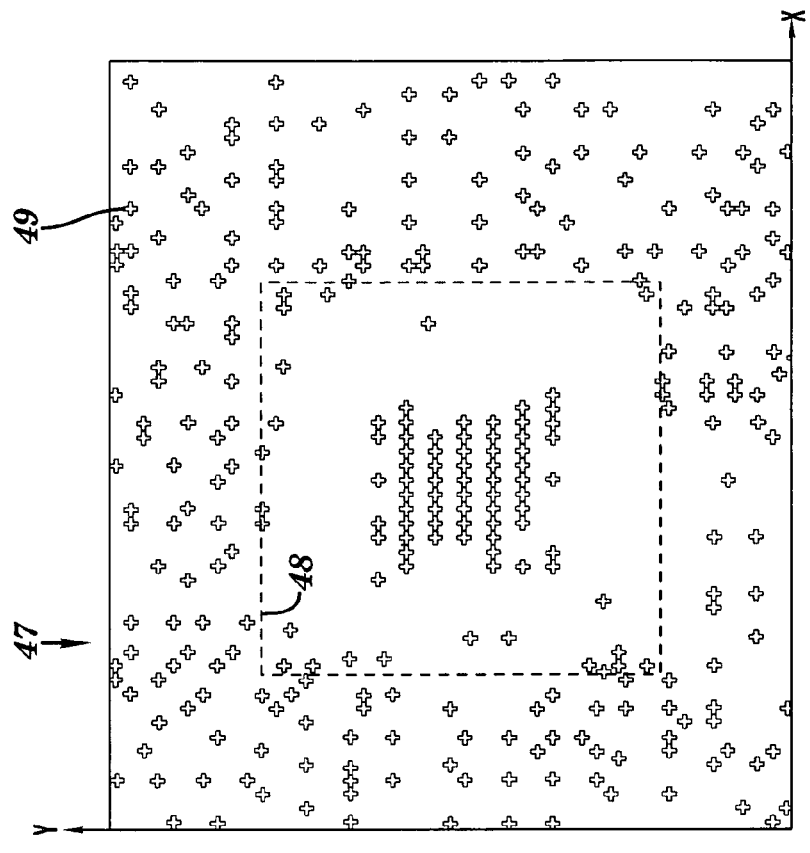
FIGS. 4A and 4B depict internal planes of respective electronic packages with outlines respectively representing projections of respective semiconductor chips attached to the top plane, in accordance with embodiments of the present invention.
Figure 4A:
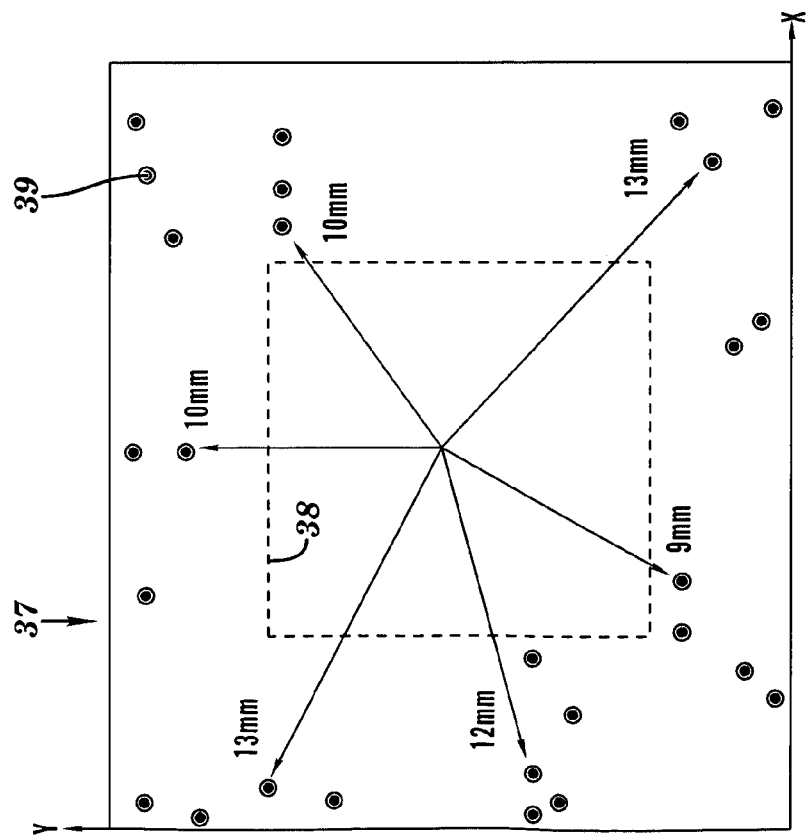

It is a design objective for the voltage losses through the electrical networks of the electronic package to be as small as possible. It is also a design objectives for the voltage losses to be as uniformly distributed as possible within each electrical network. These design objectives are reflected in a comparison between FIGS. 4A and 4B. Thus FIGS. 4A and 4B depict internal planes 37 and 47 of respective electronic packages with outlines 38 and 48 respectively representing projections of respective semiconductor chips on said internal planes, in accordance with embodiments of the present invention. The internal plane 37 has vias 39 which constitute part of the electrical networks within its electronic package, and the internal plane 47 has vias 49 which constitute part of the electrical networks within its electronic package. The sparse and nonuniform distribution of vias 39 in internal plane 37 of FIG. 4A represents a relatively poor electrical design, because the electrical resistance and consequent voltage losses of the associated electrical networks are relatively high and spatially nonuniform. In contrast, the dense and more uniform distribution of vias 49 in internal plane 47 of FIG. 4B represents a relatively good electrical design, because the electrical resistance and consequent voltage losses of the associated electrical networks are relatively low and more spatially uniform. Note that much of the electrical networks may include vias (e.g., through vias and blind vias) which provide paths of low electrical resistance. FIGS. 4A and 4B each depict orthogonal X and Y axes, which are parallel to the internal planes 37 and 47, respectively of the electronic packages.

Given a circuit design of an electronic package with electrical networks therein and ports, the present invention facilitates an analysis of said design from the point of view of voltage losses across the electrical networks. The analysis is by means of computer simulation, using modeling as illustrated in FIGS. 5A and 5B as discussed next.

Figure 5A:
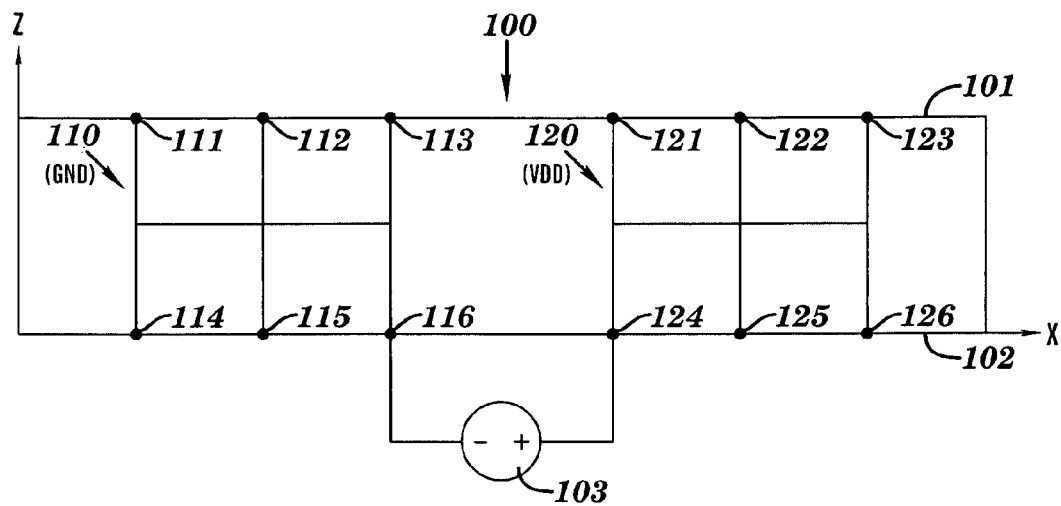
FIG. 5A depicts an electronic package, in accordance with embodiments of the present invention.

FIG. 5A depicts an electronic package 100, in accordance with embodiments of the present invention. In FIG. 5A, the electronic package 100 comprises: a voltage source 103 which is analogous to the voltage source 32 in FIG. 1, a VDD electrical network 120 electrically connected to the positive terminal of the voltage source 103, and a GND electrical network 110 electrically connected to the negative terminal of the voltage source 103. The VDD network 120 has ports 121, 122, and 123 on the top surface 101 of electronic package 100, and ports 124, 125, and 126 on the bottom surface 102 of electronic package 100. The GND network 110 has ports 111, 112, and 113 on the top surface 101 of electronic package 100, and ports 114, 115, and 116 on the bottom surface 102 of electronic package 100. The top surface 101 may be adapted to be electrically connected to a semiconductor chip (not shown), and the bottom surface 102 may be adapted to be electrically connected to a circuit board (not shown).

Figure 5B:
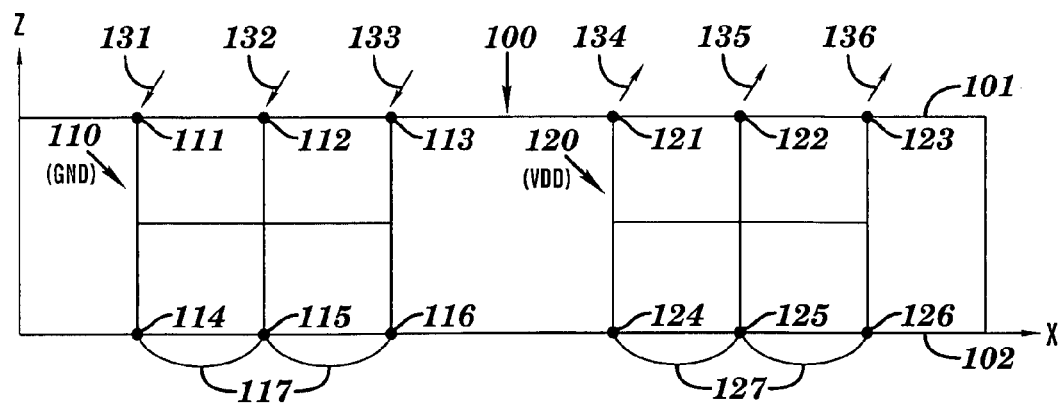
FIG. 5B depicts the electronic package of FIG. 5A as modeled for simulation purposes, in accordance with embodiments of the present invention.

FIG. 5B depicts the electronic package 100 of FIG. 5A, as modeled for simulation purposes, in accordance with embodiments of the present invention. In FIG. 5B: a) the voltage source 103 of FIG. 5A has been removed; b) the bottom ports 124-126 of the VDD electrical network 120 have been shorted together as shown by shorting wire 127 (or alternatively, the bottom ports 124-126 may be electrically connected to a common voltage); c) the bottom ports 114-116 of the GND electrical network 110 have been shorted together as shown by shorting wire 117 (or alternatively, the bottom ports 114-116 may be electrically connected to a common voltage); and d) electrical currents 131, 132, 133, 134, 135, and 136 have been specified at the ports 111, 112, 113, 121, 122, and 123, respectively. Then a computerized electrical simulation of the electronic package 100 is performed with the specified currents 131-136. The simulation determines a voltage level at each port on the top surface 101, namely ports 111-113 and 121-123. From said determined voltages at ports 111-113, electrical resistances at ports 111-113 may be determined and displayed, said electrical resistances at ports 111-113 representing the resistance between ports 111-113 and any of the shorted ports 114-116. For example, the electrical resistance at port 111 represents the electrical resistance between port 111 and any of the shorted ports 114-116. Similarly, from said determined voltages at ports 121-123, electrical resistances at ports 121-123 may be determined and displayed, said electrical resistances at ports 121-123 representing the electrical resistance between ports 121-123 and any of the shorted ports 124-126. Based on the design objectives stated supra, the electrical resistances at ports 111-113 should be as low as possible, and the variation in electrical resistance among ports 111-113 should be as small as possible. Similarly, the electrical resistances at ports 121-123 should be as low as possible, and the variation in electrical resistance among ports 121-123 should be as small as possible.

The electrical simulation relating to FIG. 5B may be performed by flowing the electrical currents 134, 135, and 136 out of ports 121, 122, and 123, respectively, and back into shorted ports 124, 125, and 126. Alternatively, the electrical simulation relating to FIG. 5B may be performed by flowing the electrical currents 134, 135, and 136 out of ports 121, 122, and 123, respectively, then flowing the currents in and out of a semiconductor chip (not shown in FIG. 5B, but see electronic device/semiconductor chip 12 in FIG. 1) that is electrically connected to the electronic package 100, then back into shorted ports 114, 115, and 116, and then to shorted ports 124, 125, and 126.

FIGS. 5A and 5B also depict orthogonal X and Z axes, which are parallel and perpendicular, respectively, to the top surface 101 of the electronic package 100.

Figure 6:
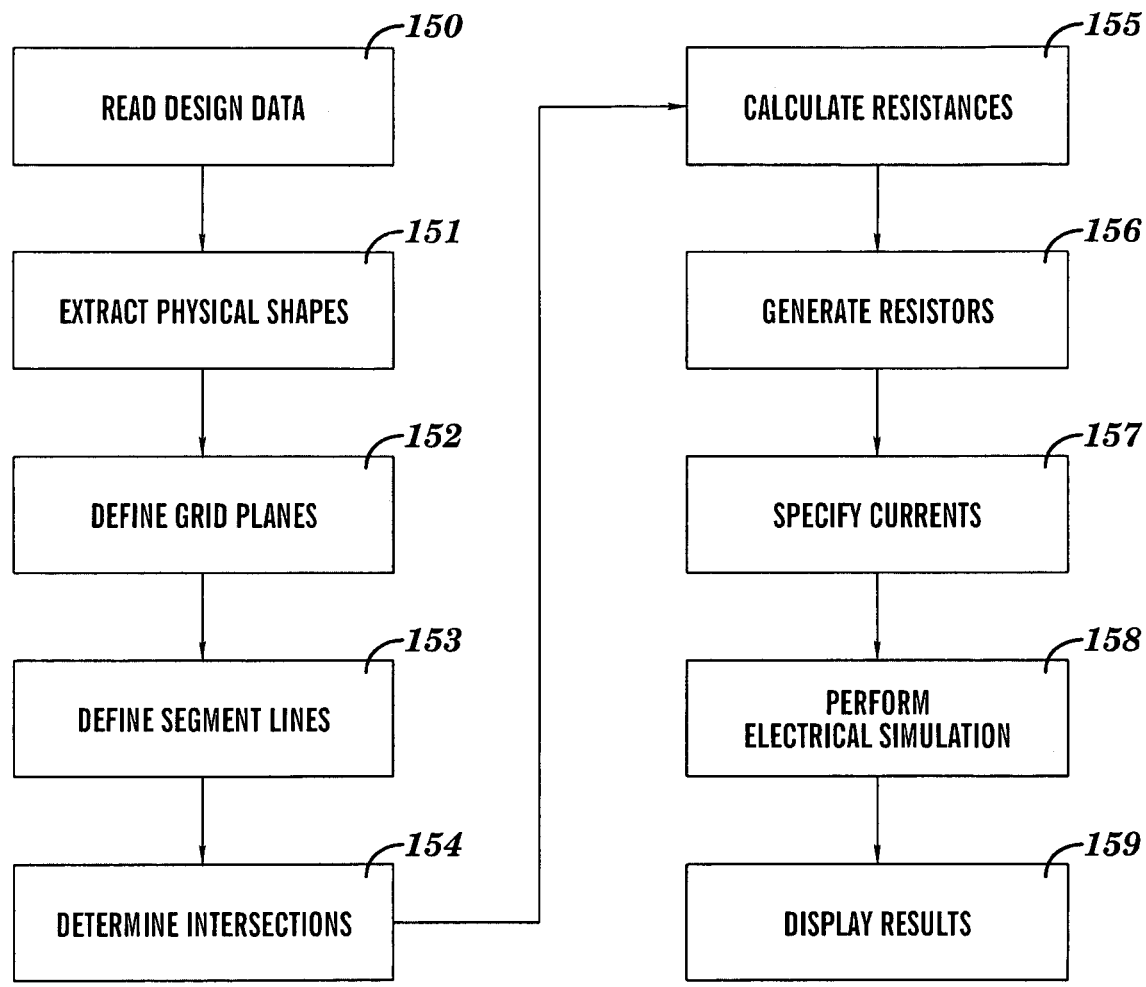
FIG. 6 is a flow chart depicting process steps in the determination and display of electrical resistances at the top surface of an electronic package based on the modeling of an electronic package, in accordance with embodiments of the present invention.

FIG. 6 is a flow chart depicting process steps 150-159 in the determination and display of electrical resistances at the top surface of an electronic package based on the modeling of the electronic package discussed supra in conjunction with FIGS. 5A-5B, in accordance with embodiments of the present invention. Assume that an electrical design exists for the electronic package having electrical networks therein and ports representing termination points of the electrical networks, said ports being located on top and bottom surfaces of the electronic package. The process steps 150-159 in the flow chart of FIG. 6 are implemented in program code (i.e., software).

In step 150, design data is read from the electrical design. Said design data includes, inter alia, geometrical data, electrical data, material properties (or materials from which material properties may be inferred), etc.

In step 151, physical shapes are extracted from the electrical design and/or the geometry data read in step 150. The resistors within the electrical networks of the electronic package will be derived from the physical shapes.

In step 152, grid planes are defined. The grid planes are parallel to the top and bottom surfaces of the electronic package. Thus, the grid planes are also parallel to each other. As an example, see grid planes 20 in FIG. 1.

Figure 7A:
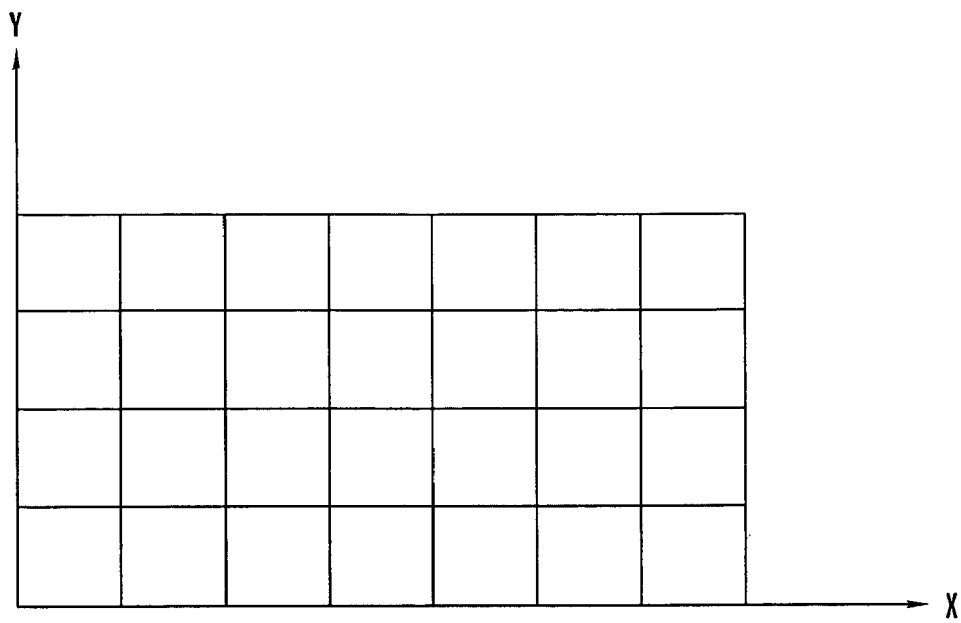
FIG. 7A depicts a grid plane within an electronic package, said grid plane having a uniform, relatively course computational mesh, in accordance with embodiments of the present invention.
Figure 7B:
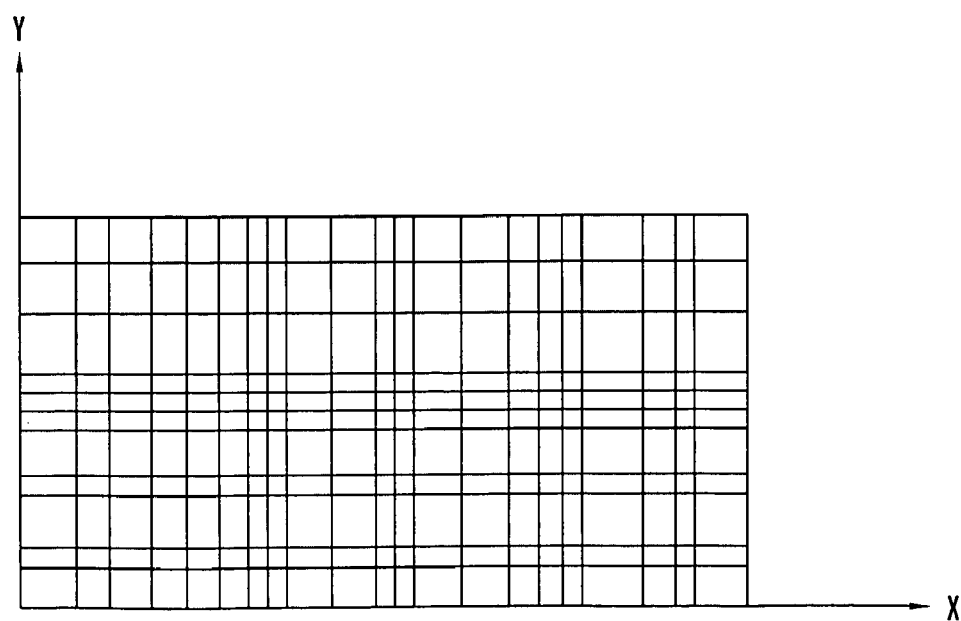
FIG. 7B depicts a grid plane within an electronic package, said grid plane having a nonuniform, relatively fine computational mesh, in accordance with embodiments of the present invention.

In step 153 of FIG. 6, segment lines are defined in each grid plane. The segment lines define a two-dimensional computational mesh in each grid plane. The two-dimensional computational mesh is represented as grid boxes. The segment lines are independently defined in each grid plane. Thus, the grid lines and associated computational mesh may be different in each grid plane. As an example, FIG. 7A depicts a first grid plane having a uniform, relatively course computational mesh, while FIG. 7B depicts a second grid plane having a nonuniform, relatively fine computational mesh. The grid planes in FIGS. 7A and 7B are defined by orthogonal axes X and Y. While FIGS. 7A and 7B depict a rectangular mesh, the grid lines and associated computational mesh may exist in any geometrical format and may thus be non-rectangular.

The electronic package may include vias which are oriented perpendicular to the top and bottom surfaces of the electronic package. Thus, the vias intersect the grid planes. In step 154, the intersections between the vias and grid planes are determined.

Figure 8:
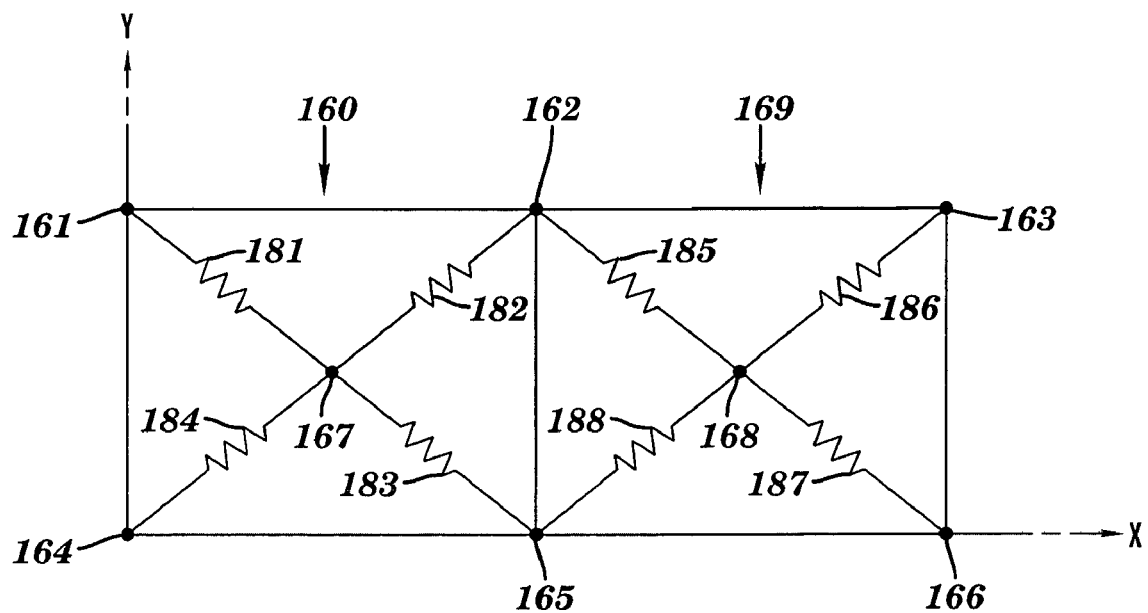
FIG. 8 depicts adjacent mesh boxes in a grid plane Y, in accordance with embodiments of the present invention

In step 155, the electrical resistances of the design are calculated. In step 156, resistors are generated in accordance with the two-dimensional computational mesh to represent the calculated electrical resistances of step 155. Each grid box defined in step 153 has a node or mesh point at its center, and there is a resistor between the center node and the corner nodes. As an example, FIG. 8 depicts adjacent mesh boxes 160 and 169 in a grid plane defined by orthogonal axes X and Y. Mesh box 160 has a center node 167 and corner nodes 161, 162, 165, and 164, wherein resistors 181, 182, 183, and 184 are shown as existing between the center node 167 and the corner nodes 161, 162, 165, and 164, respectively. Mesh box 169 has a center node 168 and corner nodes 162, 163, 166, and 165, wherein resistors 185, 186, 187, and 188 are shown as existing between the center node 168 and the corner nodes 162, 163, 166, and 165, respectively.

Figure 9:
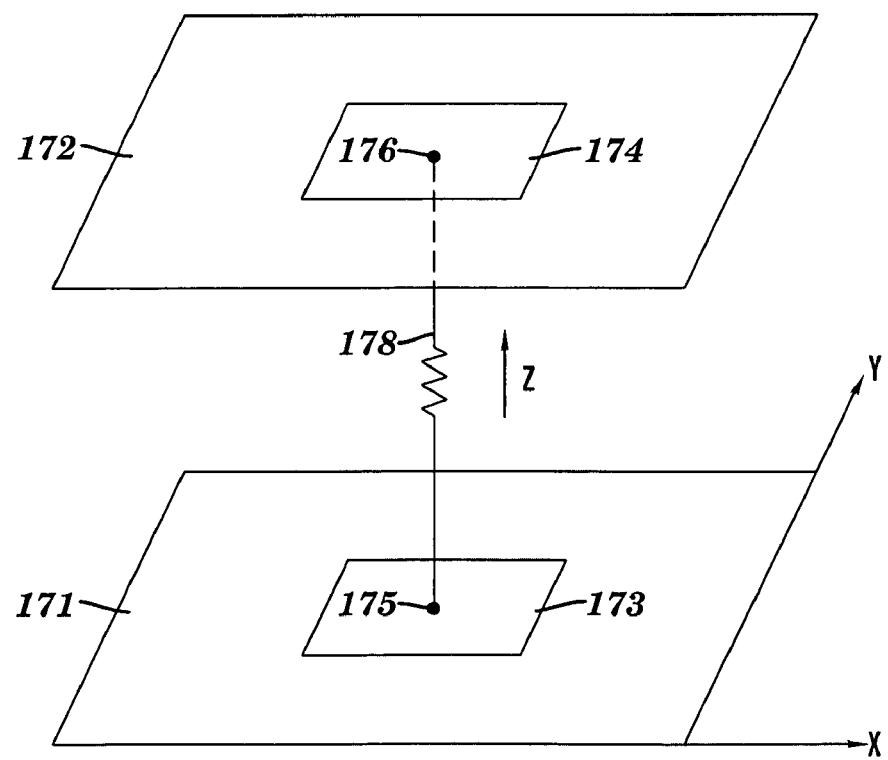
FIG. 9 depicts adjacent grid planes having corresponding mesh boxes therein, in accordance with embodiments of the present invention.

Resistors may also exist between centers of corresponding mesh boxes in adjacent grid planes. As an example, FIG. 9 depicts adjacent grid planes 171 and 172 having corresponding mesh boxes 173 and 174 therein, respectively. A resistor 178 is disposed between center node 175 of grid box 173 and center node 176 of grid box 174. Also depicted are orthogonal X, Y, and Z axes, wherein the X and Y axes are parallel to the grid planes 171 and 172, and wherein the Z axis is normal to the grid planes 171 and 172.

In step 157, electric currents are specified as boundary conditions at each port at the top surface of the electronic package, as exemplified in FIG. 5B by the electric currents 131-33 at the ports 111-113, and the electric currents 134-136 at the ports 121-123, respectively, at the top surface 101 of the electronic package 100. The specified electric currents may have equal or unequal electric current magnitudes at each of said ports.

The purpose of the specified electric currents is to provide electrical boundary conditions that enable a subsequent electrical simulation (in step 158) to be performed. Thus as an alternative to specifying currents at each port at the top surface of the electronic package, electric currents could be instead specified at each port or at any collection of ports at any other surface (e.g., at the bottom surface) of the electronic package.

In step 158, an electrical simulation is performed on the electronic package, using the data developed in the preceding steps 150-157. In the electrical simulation, the ports on the bottom surface of the electronic package are shorted together (or electrically connected to a common voltage) for each electrical network, as discussed supra in conjunction with FIG. 5B. The electrical simulation calculates voltage levels at the ports on the top surface of the electronic package, relative to the shorted ports on the bottom surface. If electric currents are specified at the ports of the bottom surface in step 157, then the electrical simulation calculates voltage levels at the ports on the bottom surface relative to the shorted ports on the top surface. Using the calculated voltage V at each port on the top surface of the electronic package and the electric current I at each respective port on the top surface, the electrical resistance R between said respective ports on the top surface and the shorted ports on the bottom surface (for the pertinent electrical network) is calculated as R=V/I. Said electrical resistances at the top ports are called "unadjusted electrical resistances", in contrast with "nearest-neighbor adjusted electrical resistances" which will be described infra.

The electrical simulation of step 158 is performed by a computer readable program code which may include a commercially available software package such as HSPICE®. The computer code may alternatively be customized; i.e., developed specifically for use with the present invention.

Figure 10:
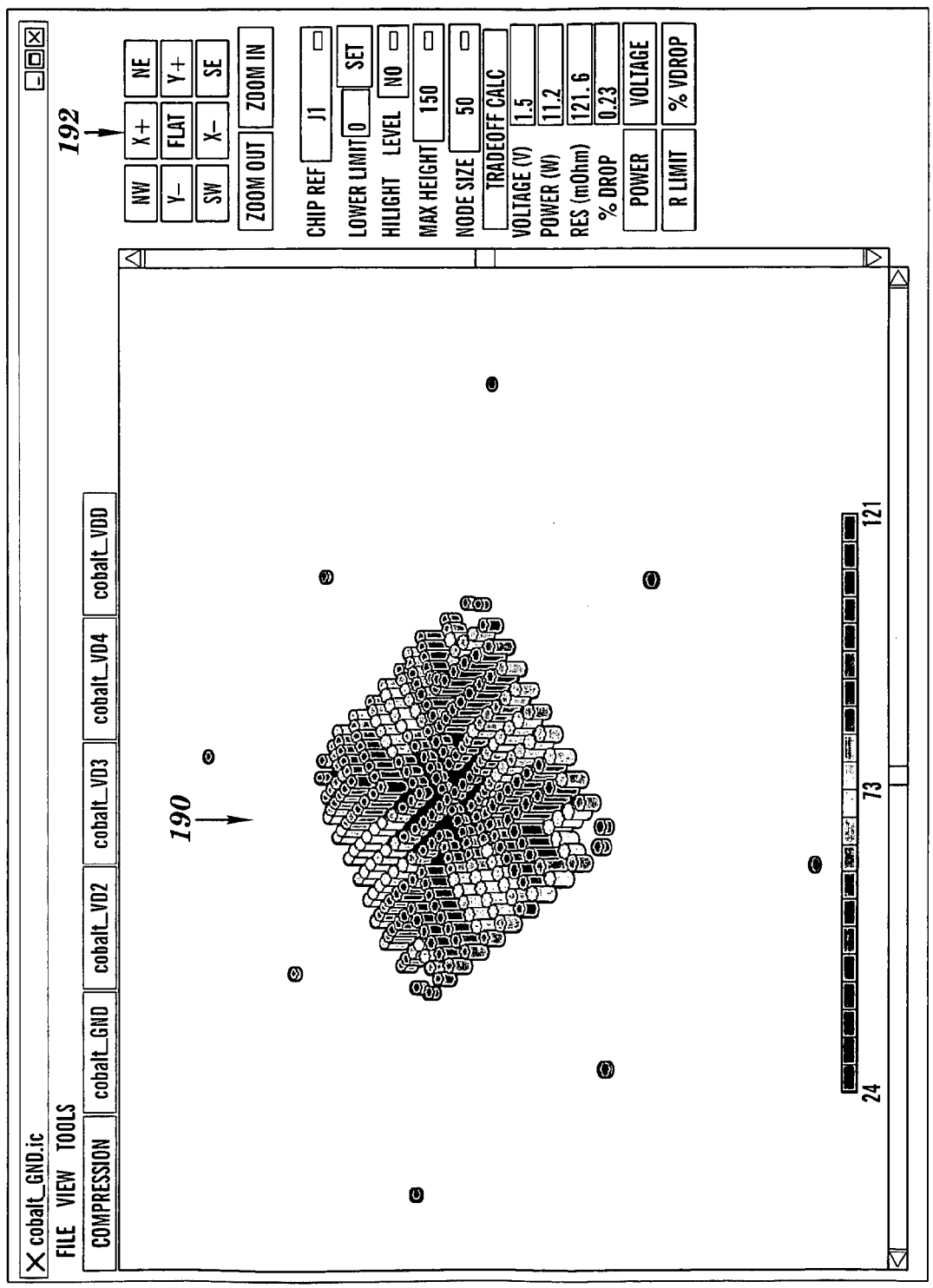
FIG. 10 comprises a perspective plot of computed electrical resistances as bars at each port on the top surface of an electronic package, in accordance with embodiments of the present invention.

Step 159 displays results from the electrical simulation of step 158, as will be next discussed in conjunction with FIG. 10. Accordingly, FIG. 10 comprises a perspective plot 190 of the computed electrical resistances of step 158 as bars at each port on the top surface of the electronic package, in accordance with embodiments of the present invention. In FIG. 10, the planar surface on which the bars are each placed is understood to represent any one surface of the electronic package (e.g., the top or bottom surface of the electronic package). Each bar has a height that is a monotonically increasing function of the computed electrical resistance at the port associated with the bar. The monotonically increasing function may be linear or nonlinear. Also, each bar has a shade of gray that is reflective of a range of electrical resistances that encompasses the computed electrical resistance at the port at which the bar is located. Alternatively, an assortment of colors could be used in place of the shades of gray. The scale of shades of gray in FIG. 10 encompasses an electrical resistance range of 24 to 121 milliohms.

In FIG. 10, the buttons cobalt_GND, cobalt_VD2, cobalt_VD3, cobalt_VD4, and cobalt_VDD each select a specific electrical network of the electrical package to be displayed when said button is selected. FIG. 10 shows the electrical network cobalt_GND as having been selected since the cobalt_GND button is shown to be selected. Thus, the perspective plot 190 is shown for the electrical network cobalt_GND that has been selected.

FIG. 10 also depicts an information panel 192. The information panel 192 includes a "Tradeoff Calc" section which includes numerical values for "Voltage (V)" (voltage supplied to the displayed electrical network), "Power (W)" (power being consumed by a semiconductor chip that is connected to the electronic package), "Res (mOhm)" (electrical resistance at a selected port on the top surface of the electronic package), and "% Drop" (voltage drop from the selected top surface port to the shorted ports at the bottom surface, as a percent of "Voltage (V)"). The top surface port selected for display of "Res (mOhm)" and "% Drop" is selected by pointing (such as with a mouse or other pointing device) to one bar in the perspective plot 190, which selects the port associated with said one bar. Thus, one could change the display of "Res (mOhm)" and "% Drop" by selecting another port by means of the mouse or other pointing device.

FIG. 10 also has a "COMPRESSION" button. Selecting the "COMPRESSION" option causes the perspective plot 190 to be a plot of "nearest-neighbor adjusted electrical resistance" instead of the "unadjusted electrical resistance", as explained next in conjunction with FIG. 11.

Figure 11:
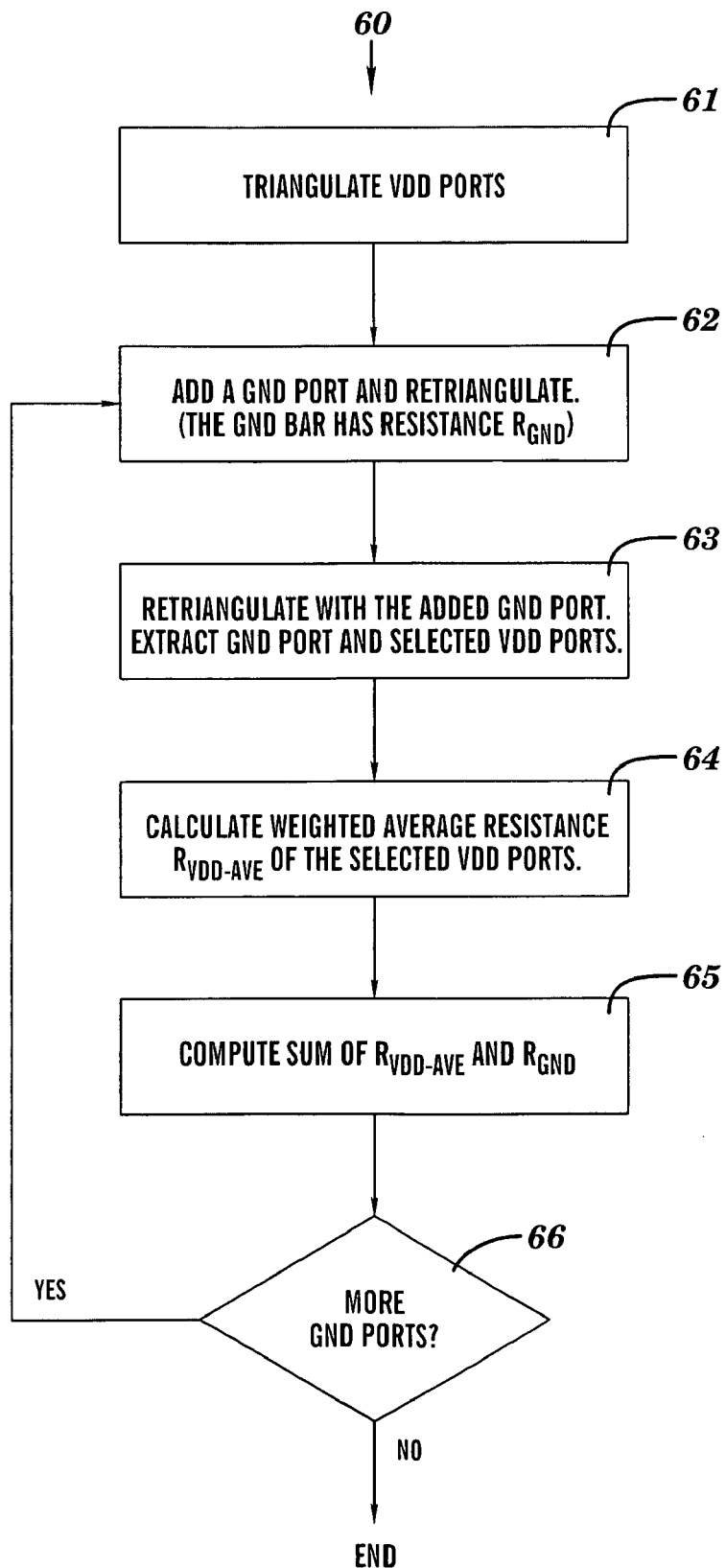
FIG. 11 is a flow chart describing the calculation of "nearest-neighbor adjusted electrical resistance", in accordance with embodiments of the present invention.

FIG. 11 is a flow chart 60 describing the calculation of "nearest-neighbor adjusted electrical resistance", in accordance with embodiments of the present invention. Consider an electronic package having electrical networks therein, said electrical networks including a VDD electrical network and a GND electrical network. Assume that the unadjusted electrical resistances at the ports of all of said electrical networks have been calculated. Steps 61-65 of FIG. 11 show how the nearest-neighbor adjusted electrical resistance (with respect to VDD) of a single GND port is calculated.

Figure 12A:
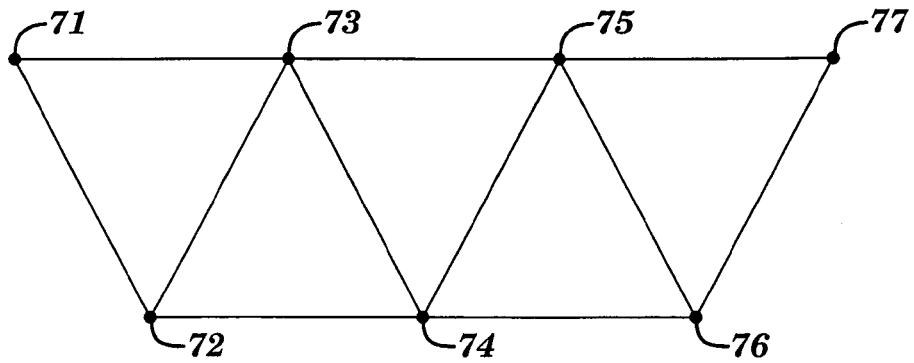
FIG. 12A depicts a set of connected triangles illustrating the result of applying the Delaney Triangulation algorithm to ports of a first electrical network of an electronic package, in accordance with embodiments of the present invention.

Step 61 performs a triangulation of all VDD ports on the top surface of the electronic package. The Delaney Triangulation algorithm may be used. The Delaney Triangulation algorithm results in a set of connected triangles with each triangle vertex holding a unique VDD port, wherein no VDD port is interior to any of said triangles. FIG. 12A illustrates such a triangulation for VDD ports 71-77.

Figure 12B:
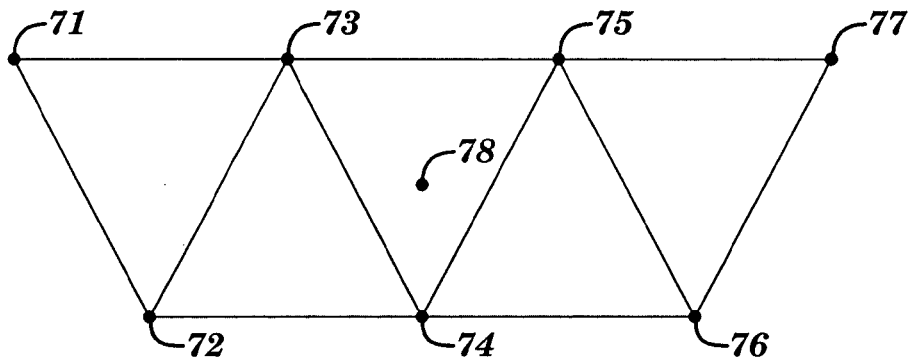
FIG. 12B depicts FIG. 12A after a point representing a port of a second electrical network of the electronic package has been added, in accordance with embodiments of the present invention.

Step 62 of FIG. 11 adds the single GND port 78 as shown in FIG. 12B.

Figure 12C:
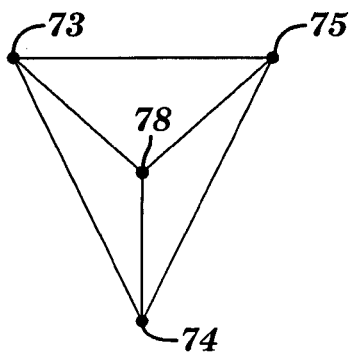
FIG. 12C depicts a set of connected triangles illustrating the result of applying the Delaney Triangulation algorithm to the configuration of FIG. 12B, in accordance with embodiments of the present invention.

Step 63 of FIG. 11 retriangulates with the added GND port 78 and extracts the added GND port and those VDD ports directly connected to the added GND port as a result of the retriangulation, as shown in FIG. 12C.

Step 64 calculates a weighted average $R_{VDD-AVE}$ of the electrical resistance of the VDD ports extracted in step 63:

$$R_{VDD-AVE} = \Sigma i [W_{VDD}(i) * R_{VDD}(i)] \quad (1)$$

Figure 13:
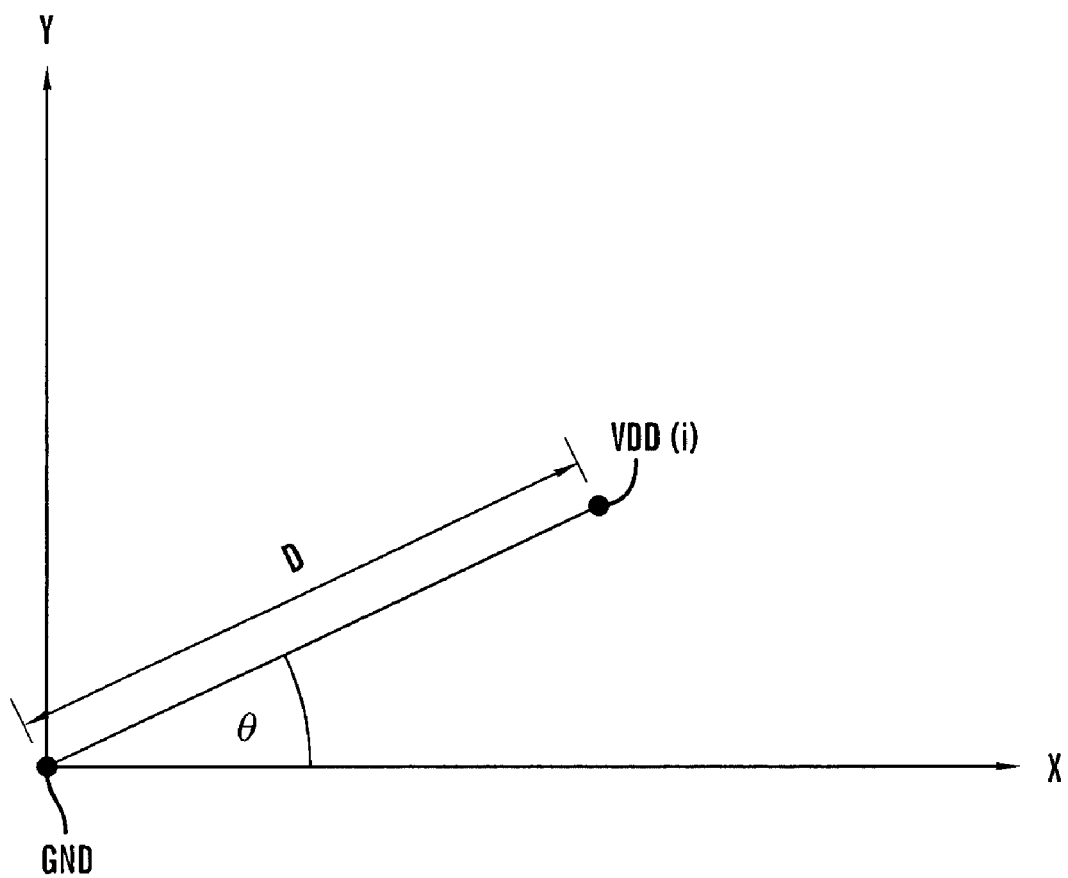
FIG. 13 depicts two ports to define the distance between the two ports, and the angle that a straight line connecting the two ports makes with a reference direction, in accordance with embodiments of the present invention.

The index i refers to the $i^{th}$ extracted VDD port VDD(i) and the summation over the index i is over all of said extracted VDD ports VDD(i). $R_{VDD}(i)$ is the unadjusted electrical resistance of port VDD(i). $W_{VDD}(i)$ is the weight of port VDD(i). $W_{VDD}(i)$ may be a function of the distance D between the GND port and VDD(i), and $W_{VDD}(i)$ may also be a function of the angular orientation θ of VDD(i) relative to the GND port. See FIG. 13 for an illustration of D and θ. For example, $W_{VDD}(i)$ may be a monotonically decreasing function of D to give more weight to those ports VDD(i) which are closest to the GND port being processed. For the example of FIG. 12C, $R_{VDD-AVE}$ is calculated according to Equation (1) by summing the product of $W_{VDD}$ and $R_{VDD}$ over the extracted points 73, 74, and 75.

Step 65 calculates the nearest-neighbor adjusted electrical resistance $R_{ADJUSTED}$ of added port GND with respect to VDD:

$$R_{ADJUSTED} = R_{VDD-AVE} + R_{GND} \quad (2)$$

wherein $R_{GND}$ is the unadjusted electrical resistance of the GND port. Note that $R_{ADJUSTED}$ is displayed in accordance with step 159 of FIG. 6, described supra.

Step 66 determines whether the nearest-neighbor adjusted electrical resistance $R_{ADJUSTED}$ of all GND ports (with respect to VDD) have been calculated. If all GND ports have had $R_{ADJUSTED}$ calculated, then the process ends. If all GND ports have not had $R_{ADJUSTED}$ calculated, then steps 62-65 are repeated for calculating $R_{ADJUSTED}$ for another GND port that replaces the last GND port processed; i.e., each execution of steps 62-65 is for one GND port. Thus when the algorithm described by FIG. 11 ends, $R_{ADJUSTED}$ has been calculated for all GND ports.

As explained supra, the present invention discloses calculation of both unadjusted electrical resistances and nearest-neighbor adjusted electrical resistances at the ports of electrical networks of an electronic package. Each of the preceding types of electrical resistance provides valuable information relating to the process of validating an electrical design. The unadjusted electrical resistances for a given electrical network provide highly localized electrical resistance information for the given electrical network at each port. The nearest-neighbor adjusted electrical resistances for a given electrical network includes the effect at each port of nearest neighbors of another electrical network but expresses the electrical resistance through a weighted averaging process that dilutes the contribution of each port to the electrical resistance. Thus the unadjusted electrical resistances are highly localized to each port, while the nearest-neighbor adjusted electrical resistances take into account the electrical environment near each port. Both the unadjusted electrical resistances and nearest-neighbor adjusted electrical resistances may be beneficially utilized in an overall design process, as will be next described in conjunction with FIG. 14.

Figure 14:
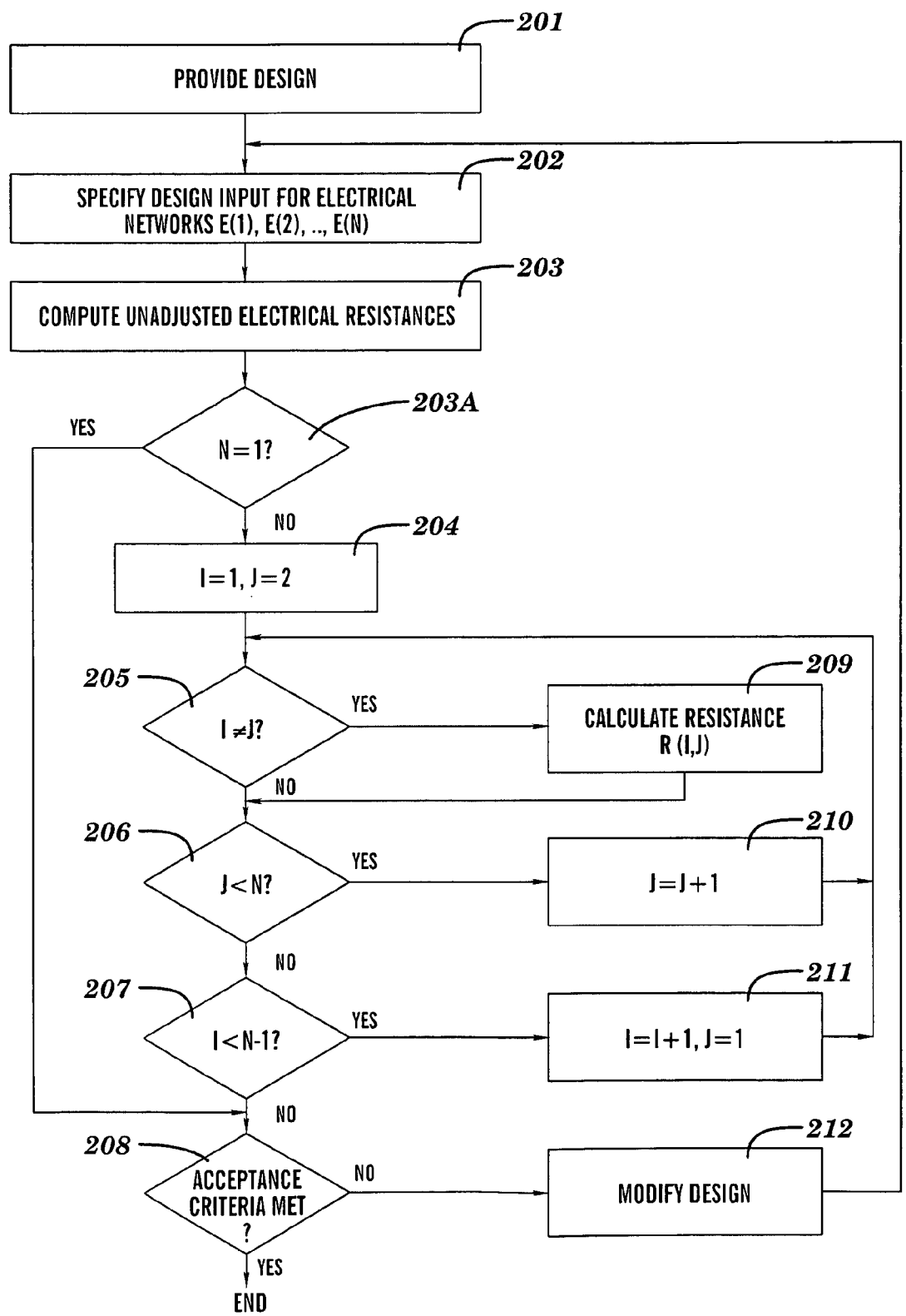
FIG. 14 is a flow chart describing a process of designing an electronic package that will have enhanced electrical performance, in accordance with embodiments of the present invention.

FIG. 14 is a flow chart depicting process steps 201-212 for describing a process of designing an electronic package that will have enhanced electrical performance, in accordance with embodiments of the present invention. This process uses computerized simulation and is iterative, so that a design could be achieved in conformity with predetermined acceptance criteria.

Step 201 provides a design for an electronic package having N electrical networks therein (N>1). The N electric networks are denoted as electrical networks E(1), E(2), . . . , E(N). As a non-limiting example, N=5, E(1)=GND, E(2)=VDD1, E(3)=VDD2, E(4)=VDD3, E(5)=VDD4.

Step 202 specifies design input to a computer readable program code for implementing the simulation. The design input is derived from the design of step 201 or from the modified design of step 212 (described infra). The design data includes a description of the N electrical networks comprised by the electronic package. The description includes an electrical path map of the N electrical networks. The description further includes specification of a plurality of first ports on a first side (e.g., top side) of the electronic package for each electrical network such that all of the first ports are electrically isolated from one another. The description further includes specification of a plurality of second ports on a second side (e.g., bottom side) of the electronic package for each electrical network such that all of the second ports are electrically shorted with one another. The second side of the electronic package may be opposite the first side of the electronic package. The description further includes specification of, inter alia, geometrical data, electrical data, material properties (or materials from which material properties may be inferred), etc., relating to the N electrical networks.

Step 203 executes the computer readable program code by a processor of a computer system. The executing in step 203 includes computing for each network E(1), E(2), . . . , E(N), an unadjusted electrical resistance between each first port and a port of the second ports. The unadjusted electrical resistance is calculated in accordance with the flow chart of FIG. 6, described supra, wherein the numerical value of the unadjusted electrical resistance is determined in step 158 of FIG. 6. Step 203 of FIG. 14 may also include a display of unadjusted electrical resistances as described supra in conjunction with step 159 of FIG. 6. Thus, step 203 determines the unadjusted electrical resistances at all first ports of each electrical network.

Step 203A determines whether N=1. If N=1 then step 208 is next executed else step 204 is next executed. N=1 is a special case in which nearest-neighbor adjusted electrical resistances are not computed.

Step 204 sets indexes I and J as follows: I=1 and J=2. The indexes I and J are used to reference the electrical networks E(I) and E(J), respectively, wherein I and J are each within the range of 1 to N.

Step 205 determines if I≠J. If I≠J then step 209 is next executed to determine the resistance R(I,J) which is defined as the nearest-neighbor adjusted electrical resistance of electrical network E(I) with respect to electrical network E(J) between each first port of E(I) and a port of the second ports of E(I). The nearest-neighbor adjusted electrical resistance ($R_{AVE}$) is calculated in accordance with the flow chart of FIG. 11, described supra, wherein E(I) and E(J) respectively have the role of GND and VDD in FIG. 11. Note that $R_{AVE}$ is displayed in accordance with step 159 of FIG. 6, described supra. Each first port of E(I) has its own nearest-neighbor adjusted electrical resistance R(I,J).

After step 209, the method executes step 206. If I=J in step 205 then step 206 is next executed. When I=J, step 209 is not executed because a port of a network cannot have a nearest-neighbor adjusted electrical resistance with respect to its own network.

Step 206 determines if J<N. If J<N then J is incremented by 1 in step 210 followed by looping back to step 205. If J=N then step 207 is next executed.

Step 207 determines if I<N−1. If I<N−1 then I is incremented by 1 in step 211 followed by looping back to step 205. If I=N−1 then step 208 is next executed.

Step 208 determines whether the computed unadjusted electrical resistances of step 203 (and the computed nearest-neighbor adjusted electrical resistances of step 209 if N>1) collectively satisfy an acceptance criteria. If the acceptance criteria is satisfied, then the process of FIG. 14 ends. If the acceptance criteria is not satisfied, then the design for the electronic package is modified in step 212 so as to increase the probability of satisfying the acceptance criteria in the next design iteration. Following step 212, the process loops back to step 202 to begin the next design iteration. The design iterations continue until the acceptance criteria is satisfied or until a predetermined maximum number of design iterations have been executed.

Any desired acceptance criteria for step 208 may be used. A non-limiting example of an acceptance criteria is: all unadjusted electrical resistances must not exceed a first predetermined value, all nearest-neighbor adjusted electrical resistances must not exceed a second predetermined value, the standard deviation of the unadjusted electrical resistances of each electrical network must not exceed a third predetermined value, and the standard deviation of the nearest-neighbor adjusted electrical resistances of each electrical network (with respect to at least one other network) must not exceed a fourth predetermined value.

Figure 15:
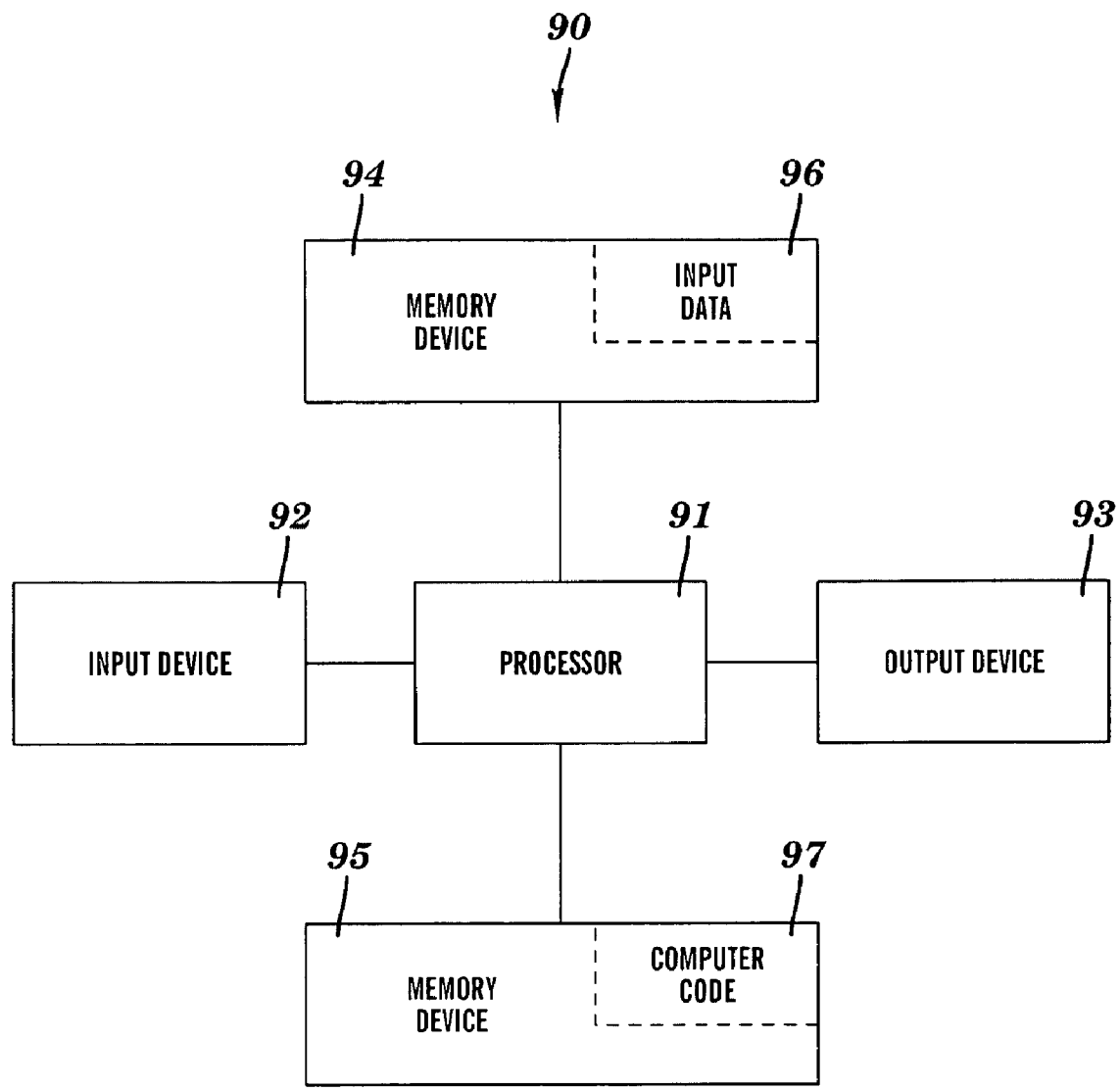
FIG. 15 depicts a computer system used for determining and displaying electrical resistances within an electronic package, in accordance with embodiments of the present invention.

FIG. 15 illustrates a computer system 90 used for determining and displaying electrical resistances within an electronic package and for designing an electronic package that will have enhanced electrical performance, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for determining and displaying electrical resistances within an electronic package and for designing an electronic package that will have enhanced electrical performance. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 15) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 15 shows the computer system 90 as a particular configuration of hardware and software, any configuration of hardware and software, as would be known to a person of ordinary skill in the art, may be utilized for the purposes stated supra in conjunction with the particular computer system 90 of FIG. 15. For example, the memory devices 94 and 95 may be portions of a single memory device rather than separate memory devices.

The preceding description of the calculation and display of unadjusted electrical resistances in accordance with the flow chart of FIG. 6, or of nearest-neighbor adjusted electrical resistances in accordance with the flow chart of FIG. 11, or a process of designing an electronic package that will have enhanced electrical performance, considered the electronic package as being isolated from any semiconductor chip that may be subsequently connected to the electronic package during an operational phase of the electronic carrier. However, the preceding procedures and calculations could tale into account the presence of a semiconductor chip connected to the electronic package as shown in FIG. 1. If the semiconductor chip is taken into account, the calculation will be more complex but the calculated results will be more accurate. For a large number of applications of the present invention, however, the preceding procedures and calculations without taking into account the presence of a semiconductor chip will be sufficiently accurate. Additionally, the preceding procedures and calculations may be applied to a semiconductor chip in isolation from any electronic package connected thereto, with the electrical resistances being calculated for ports on a surface of the semiconductor chip.

While the embodiments described herein included electrical networks within a substrate (e.g., a chip carrier) and specified electrical currents on the top surface of the substrate, the scope of the present invention includes specification of electrical currents on a group of ports distributed on any surface of the substrate and a display of electrical resistance (such as the display of FIG. 10) at said group of ports. Moreover, the scope of the present invention also includes specification of electrical currents at any group of electrical nodes even if the electrical nodes are not on or within a substrate, and a display of electrical resistance (such as the display of FIG. 10) at said group of electrical nodes. As an example, the group of electrical nodes may constitute a power distribution grid for a geographical area such as the northeastern section of the United States.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A computer program product, comprising a computer readable physically tangible storage device having a computer readable program code stored therein, wherein the computer readable program code upon being executed by a computer performs an electrical resistance determination by a method comprising the steps of:
    receiving input, said input including a description of N electrical networks comprised by a first substrate, said description including specification of a plurality of first ports on a first side of the first substrate for each electrical network such that all of said first ports are electrically isolated from one another, said description further including specification of a plurality of second ports on a second side of the first substrate for each electrical network such that all of said second ports are electrically connected to a common voltage, said $N \geq 1$; and
    following said receiving, executing said computer readable program code by a processor of a computer system, said executing including computing for each electrical network of the N electrical networks an unadjusted electrical resistance between each first port and a port of the second ports.

2. The computer program product of claim 1, said computing including:
    calculating a voltage at each said first port, given an electrical current specified at each said first port; and
    computing said electrical resistances from said specified electrical currents and said calculated voltages.

3. The computer program product of claim 1, said specifying including:
    providing a design of the N electrical networks comprised by the substrate; and
    determining from said design said input to the computer readable program code.

4. The computer program product of claim 1, further comprising:
    specifying as input to the computer readable program code a description of at least one electrical network comprised by a second substrate, said description including specification of a plurality of third ports on a side of the second substrate for each electrical network of the second substrate such that all of said third ports are electrically isolated from one another; and
    specifying as input to the computer readable program code a description of electrical connections between the first ports of the first substrate and the third ports of the second substrate, said computing of each said electrical resistance taking into account said electrical interconnections and said at least one electrical network comprised by said second substrate.

5. The computer program product of claim 4, wherein the first substrate comprises a chip carrier, and wherein the second substrate comprises a semiconductor chip.

6. The computer program product of claim 1, wherein the method further comprises the determining whether the computed unadjusted electrical resistances collectively satisfy acceptance criteria.

7. The computer program product of claim 6, wherein the acceptance criteria is that for each electrical network of the N electrical networks:
    each computed unadjusted electrical resistance does not exceed a first predetermined value; and
    a standard deviation of each computed unadjusted electrical resistance does not exceed a second predetermined value.

8. The computer program product of claim 6, wherein said determining has determined that the computed unadjusted electrical resistances collectively do not satisfy the acceptance criteria, and wherein the method further comprises after said determining:
    modifying said description so as to increase a probability of the computed unadjusted electrical resistances collectively satisfying the acceptance criteria, followed by iteratively performing said receiving, executing, determining, and modifying until the computed unadjusted electrical resistances collectively satisfy the acceptance criteria.

9. The computer program product of claim 1, wherein $N \geq 2$.

10. The computer program product of claim 1,
    wherein the electrical resistance is a nearest-neighbor adjusted electrical resistance between each first port and the port of the second ports,
    said nearest-neighbor adjusted electrical resistance being with respect to a second electrical network of the at least one electrical network,
    said nearest neighbor adjusted electrical resistance being determined in accordance with Delaney Triangulation,
    said executing further including displaying a perspective plot of said computed electrical resistances as a bar oriented about normal to each first port on the first side of the substrate,
    each bar having a height that is a monotonically increasing function of the computed electrical resistance at the first port at which the bar is located,
    said monotonically increasing function being a linearly increasing function,
    each bar having a color or shade of gray that is reflective of a range of electrical resistances that encompasses the computed electrical resistance at the first port at which the bar is located,
    said executing further including, in response to a selection of a bar B of the perspective plot, displaying a numerical measure of the computed electrical resistance at the first port that is associated with the bar B.

11. A computer system comprising a processor and a computer readable memory unit coupled to the processor, said memory unit containing program code configured to be executed by the processor to perform an electrical resistance determination method comprising the steps of:
    receiving input, said input including a description of N electrical networks comprised by a first substrate, said description including specification of a plurality of first ports on a first side of the first substrate for each electrical network such that all of said first ports are electrically isolated from one another, said description further including specification of a plurality of second ports on a second side of the first substrate for each electrical network such that all of said second ports are electrically connected to a common voltage, said N≧1; and following said receiving, executing said computer readable program code by a processor of a computer system, said executing including computing for each electrical network of the N electrical networks an unadjusted electrical resistance between each first port and a port of the second ports.

12. The computer system of claim 11, said computing including:
calculating a voltage at each said first port, given an electrical current specified at each said first port; and
computing said electrical resistances from said specified electrical currents and said calculated voltages.

13. The computer system of claim 11, said specifying including:
providing a design of the N electrical networks comprised by the substrate; and
determining from said design said input to the computer readable program code.

14. The computer system of claim 11, further comprising:
specifying as input to the computer readable program code a description of at least one electrical network comprised by a second substrate, said description including specification of a plurality of third ports on a side of the second substrate for each electrical network of the second substrate such that all of said third ports are electrically isolated from one another; and
specifying as input to the computer readable program code a description of electrical connections between the first ports of the first substrate and the third ports of the second substrate, said computing of each said electrical resistance taking into account said electrical interconnections and said at least one electrical network comprised by said second substrate.

15. The computer system of claim 14, wherein the first substrate comprises a chip carrier, and wherein the second substrate comprises a semiconductor chip.

16. The computer system of claim 11, wherein the method further comprises the determining whether the computed unadjusted electrical resistances collectively satisfy acceptance criteria.

17. The computer system of claim 16, wherein the acceptance criteria is that for each electrical network of the N electrical networks:

each computed unadjusted electrical resistance does not exceed a first predetermined value; and
a standard deviation of each computed unadjusted electrical resistance does not exceed a second predetermined value.

18. The computer system of claim 16, wherein said determining has determined that the computed unadjusted electrical resistances collectively do not satisfy the acceptance criteria, and wherein the method further comprises after said determining:
modifying said description so as to increase a probability of the computed unadjusted electrical resistances collectively satisfying the acceptance criteria, followed by iteratively performing said receiving, executing, determining, and modifying until the computed unadjusted electrical resistances collectively satisfy the acceptance criteria.

19. The computer system of claim 11, wherein N≧2.

20. The computer system of claim 11,
wherein the electrical resistance is a nearest-neighbor adjusted electrical resistance between each first port and the port of the second ports,
said nearest-neighbor adjusted electrical resistance being with respect to a second electrical network of the at least one electrical network,
said nearest neighbor adjusted electrical resistance being determined in accordance with Delaney Triangulation,
said executing further including displaying a perspective plot of said computed electrical resistances as a bar oriented about normal to each first port on the first side of the substrate,
each bar having a height that is a monotonically increasing function of the computed electrical resistance at the first port at which the bar is located,
said monotonically increasing function being a linearly increasing function,
each bar having a color or shade of gray that is reflective of a range of electrical resistances that encompasses the computed electrical resistance at the first port at which the bar is located,
said executing further including, in response to a selection of a bar B of the perspective plot, displaying a numerical measure of the computed electrical resistance at the first port that is associated with the bar B.

* * * * *